United States Patent [19]

Kaufman et al.

[11] Patent Number: 4,703,274
[45] Date of Patent: Oct. 27, 1987

[54] ARRANGEMENT OF RF COILS AND RELATED METHOD FOR MAGNETIC RESONANCE IMAGING OF A SELECTED INNER-VOLUME

[75] Inventors: Leon Kaufman; Joseph W. Carlson, both of San Francisco; Mitsuaki Arakawa, Hillsborough; Barry M. McCarten, Piedmont; John H. Fehn, El Sobrante, all of Calif.

[73] Assignee: The Regents of the University of California, Berkeley, Calif.

[21] Appl. No.: 901,594

[22] Filed: Aug. 29, 1986

[51] Int. Cl.$^4$ .............................................. G01R 33/20
[52] U.S. Cl. ..................................... 324/318; 324/309
[58] Field of Search ............... 324/300, 307, 308, 309, 324/311, 313, 314, 318, 322

[56] References Cited

U.S. PATENT DOCUMENTS 4,297,637 10/1981 Crooks et al. ...................... 324/309

Primary Examiner—Michael J. Tokar
Attorney, Agent, or Firm—Nixon & Vanderhye

[57] ABSTRACT

Shaped RF field distributions from separate "surface" coils overlap to define a limited inner-volume deep within a human body or other object under examination. A spin echo MRI signal is effectively elicited only from such limited inner-volume so as to permit conventional MRI signal processing (e.g., utilizing Fourier Transformations) to derive and display magnetic resonance images of desired cross-sections of the limited inner-volume thus avoiding possible motion artifact and/or other potential noise sources located elsewhere in the object. A special receiver coil decoupling circuit is used to automatically increase its resonant frequency during RF transmit times.

21 Claims, 4 Drawing Figures

ARRANGEMENT OF RF COILS AND RELATED METHOD FOR MAGNETIC RESONANCE IMAGING OF A SELECTED INNER-VOLUME

This invention is related to the field of magnetic resonance imaging (MRI) utilizing nuclear magnetic resonance (NMR) phenomena. It is particularly related to an advantageous arrangement of RF coils (and a related method) for effectively limiting the field of view of an MRI system to a selected, relatively smaller, inner-volume disposed within a human body or other object under examination.

This application is generally related to earlier filed patents and applications of Crooks et al including U.S. Pat. Nos. 4,297,637; 4,318,043; 4,471,305; 4,599,565; 4,607,225 the pending application to Arakawa et al Ser. No. 827,609 filed Feb. 10, 1986; the pending application to Harrison et al Ser. No. 827,638 filed Feb. 10, 1986; the application to Arakawa et al Ser. No. 888,074 filed Jul. 22, 1986 and the application to Fehn et al Ser. No. 878,369 filed June 25, 1986. This case is especially related to the commonly owned, copending application of Arakawa Ser. No. 901,596 Aug. 29, 1986 filed concurrently herewith and also teaching a technique for selective MRI imaging of an inner volume (albeit using passive techniques as opposed to the active techniques described herein). The contents of these referenced related patents and/or patent applications is hereby incorporated by reference.

Magnetic resonance imaging (MRI) is now coming into wide-spread commercial usage. Nevertheless, there are still many possible areas for improvement. For example, desired improvements are still sought to improve the signal-to-noise ratio in NMR responses, to minimize motion artifact and to otherwise improve the resulting NMR images.

In some early attempts to achieve magnetic resonance imaging, it was attempted to use highly "focussed" magnetic and/or RF fields so as to achieve NMR coupling to only a single (i.e., a very small "pixel" or picture element) at one time and then to selectively "scan" such a "sensitive" point volume throughout a larger volume to be imaged. This approach has now been largely (if not entirely) discarded in favor of Fourier Transformation techniques which derive elemental pixel or voxel (i.e., a three-dimensional "pixel" or "point" volume element) NMR measurements which collectively may be arrayed and displayed to produce a magnetic resonance image (MRI) by a complex sequence of signal process.ing operations performed upon NMR response signals received engross from an entire coupled volume (typically an entire cross-section of a living subject or other object to be imaged).

Unfortunately, when the transmitted and received RF signals are coupled to an entire cross-section of the object to be imaged, the effective signal-to-noise ratio of the resulting image sometimes suffers. In particular, motion artifact or other noise sources potentially associated with areas of the cross-section of no real concern or interest are nevertheless also coupled to the transmitted/received RF signals and thus necessarily and unavoidably contribute to some degradation of the effective signal-to-noise ratio for the derived MRI data used to derive the entire cross-sectional image.

Others have recognized that so-called "surface" RF coils may be employed so as to effectively couple to an image only a selected area of interest—thus avoiding unnecessary possible noise contamination from motion artifact or other noise sources assoicated with other elements of the object under test. (See, for example, some of the above referenced related applications.) However, a "surface" RF coil is, almost by definition, not effective in coupling to selected inner-volumes (i.e., those organs embedded deeply within the middle cross-sectional area of a subject under test).

We have, however, now discovered an arrangement of plural active RF "surface" coils for magnetic resonance imaging which permits effective and selective coupling to a limited inner-volume of an object under test. In this manner, signal-to-noise ratio improvements can be achieved for magnetic resonance images where the area of interest is contained wholly within the selected inner-volume.

In brief overview, the exemplary embodiment of this invention utilizes a pair of active "surface" coils—albeit they need not be disposed directly adjacent a surface of the subject under test. The coils (or at least two of them) are preferably (but not necessarily) disposed on opposite sides of the object under test and define shaped RF radiation field patterns which overlap in a central area therebetween which, in conjunction with chosen MRI process parameters, can be utilized to effect MRI coupling to only a selected inner-volume of an object under test.

The RF coils used in this invention are termed "active" in that they are connected in active RF MRI transmit and/or receive circuits—as opposed to not being so connected and thus constituting only "passive" devices.

In the exemplary method, NMR RF pulses are transmitted into the object from at least one such active RF coil disposed at an external side position of the object and using a shaped RF field distribution so as to produce successive 90° and 180° NMR flip angles only within a limited inner-volume of the object. Subsequently, the resulting spin echo NMR RF responses emanating from such inner-volume are received and detected using an active RF coil which is also disposed in an external side position of the object and also having a shaped RF field distribution (or radiation "pattern") which overlaps and also helps define the limited inner-volume when considered in conjunction with the shaped RF field distribution used to generate the 90° and 180° NMR flip angles.

When one of the coils is used as an RF transmitter, the degree or magnitude of NMR flip angle actually achieved from a transmitted NMR RF pulse decreases as a function of distance from the coil. In general, contours of equal NMR flip angle can be conceptually visualized as "cup"-shaped surfaces. If suitable NMR RF energy (e.g., integrated magnitude with respect to time) are employed, only nuclei lying at some considerable distance from the coil will actually undergo the requisite 90° or 180° flip angles. Nuclei lying within the cup-shaped contours disposed nearer to the coil will undergo greater flip angles while those lying still further from the coil will undergo less than the requisite flip angle.

In the preferred exemplary embodiment, another or opposite coil is coupled to the MRI RF receiver and it likewise defines oppositely directed "cup"-shaped contours of effective receiver sensitivity (e.g., as measured in units of Gauss per amp or the like). As will be appreciated upon reflection, the effective sensitivity also decreases as a function of distance from this coil and, accordingly, the NMR receiving circuitry is effectively coupled only above some predetermined level of minimum receiver sensitivity. The net result is that the "cup"-shaped field distribution for the transmitter coil overlaps with the field detection sensitivity distribution of the receiver coil and a limited selected inner-volume is thus defined at the overlapping region where the initial flip angle, the 180° flip angle and adequate receiver detection sensitivity to the resulting NMR spin echoes are all simultaneously within the operative limits of the MRI system.

Although it is desired to have shaped field distributions so as to achieve the selected inner-volume, within that inner-volume is it also desirable to achieve some uniformity. Accordingly, the preferred embodiment uses a fairly large transmitting coil (e.g., a single conductive loop with a diameter approximately equal to the separation between transmitting and receiving coils). A somewhat smaller receive coil is useful so as to further restrict the field of view of the receiver and thus further limit possible noise contamination of the collected data (e.g., a single conductive loop having a diameter of approximately 0.4 to 0.5 that of the transmitting coil).

It is also possible to adjust the relative position of the selected inner-volume between the two coil structures by appropriately adjusting the power of the RF fields transmitted by the MRI system.

In an alternate embodiment, one of the coils may be used to transmit the initial nutation angle RF pulse while the other coil is used to transmit the following 180° RF nutation pulse. One or both of the coils can then be used as a receiver (or alternatively, yet another auxiliary coil might be used for RF receiving purposes). In such an alternate embodiment, both coils desirably may be of the same diameter to achieve somewhat more selectivity (e.g., a better defined and somewhat smaller sub-volume). However, this alternate embodiment may possess a more limited (or perhaps even nonexistent) ability to change the location of the selected sub-volume from a position equidistant between the two coil structures.

We have also discovered that it is highly desirable (actually necessary for optimum results) to decouple the coils from each other when only one is active (e.g., during receive and/or during transmit functions). A special self-switching reactive circuit may, for example, be connected across the receive coil so as to automatically increase its resonant frequency during transmitter operation, thereby acting to decouple the receive coil during this phase of the imaging procedure.

A more complete understanding and appreciation of these and other objects of this invention may be had by carefully reading the following detailed description of presently preferred embodiments when taken in conjunction with the accompanying drawings, of which:

Figure 1:
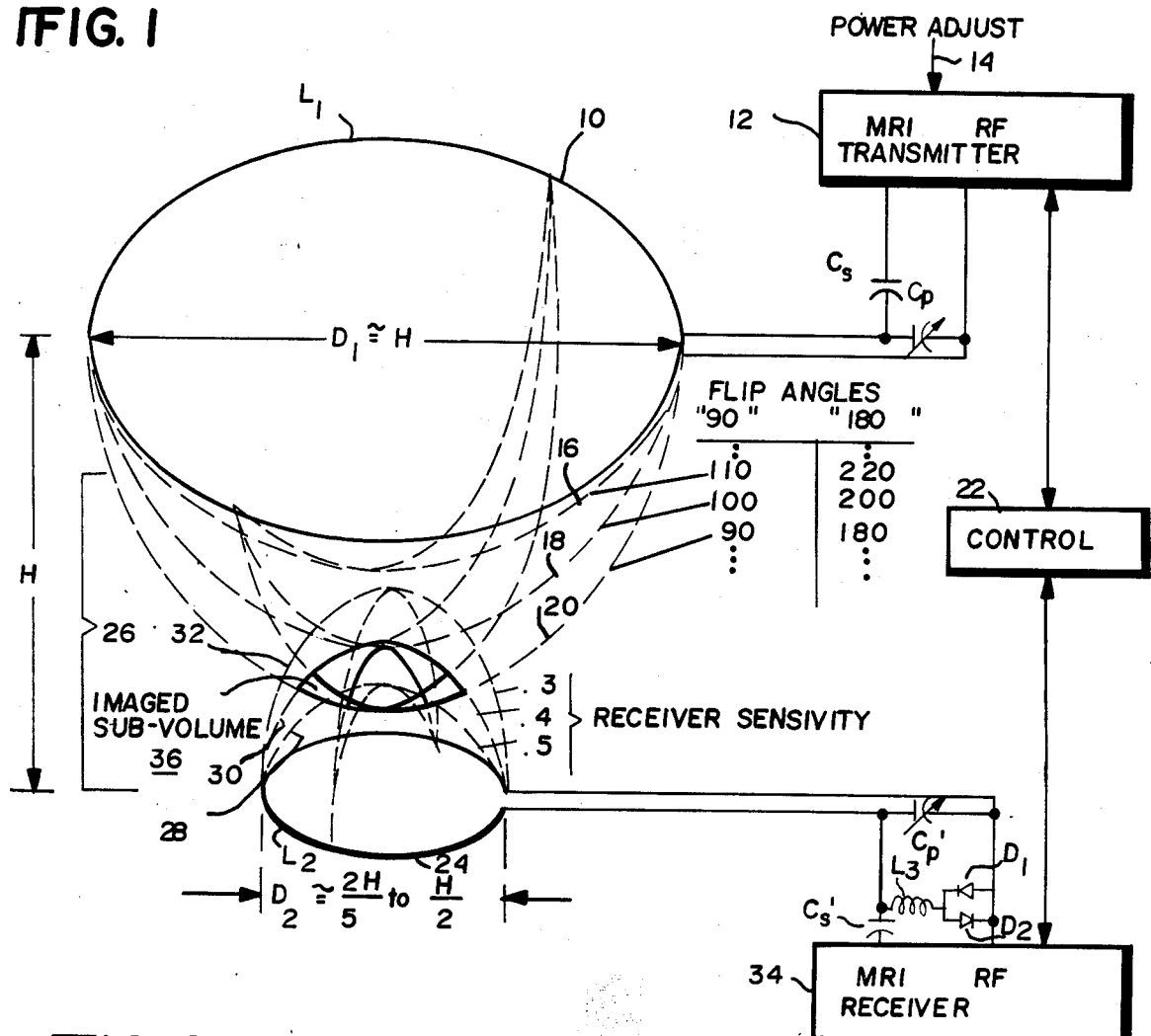
FIG. 1 is a schematic, partly perspective, depiction of a first exemplary embodiment of this invention.

Those familiar with the art of magnetic resonance imaging will appreciate the fact that maximum signal is received if: (1) those nuclei have been properly excited by transmitted RF energy (e.g., with an initial 90° NMR flip angle RF pulse followed by one or more 180° NMR flip angle RF pulses in the exemplary embodiment), and (2) the RF receiving coil and circuitry is properly poised so as to be able to detect a resultant NMR response from these selectively excited nuclei (e.g., an NMR spin echo RF response in the exemplary embodiment). RF coils of many different designs have been utilized in the past for coupling the necessary transmitted RF fields into an object under test and for coupling the resultant RF responses out of the object under test. While the nature of the electronic transmitting and receiving circuits is an important factor, it will be recognized that the RF coil structures effectively operate as RF transmit/receive antennas. Sometimes the same coil structure is used both to transmit and receive RF signals while, in other arrangements, separate coils (i.e., "antennas") may be utilized for separately transmitting and receiving RF signals passing into and out of the object under test.

The present invention utilizes a pair of coils having non-symmetric, non-homogeneous field distributions (or "radiation patterns" in the usual "antenna" parlance). While such coils may be of a simple single "loop" (as in an exemplary embodiment), they may also take on more complex three dimensional configurations (e.g., as in loop gap coils where the conductors approximate a FIG. 8 configuration). Such coils are typically referred to as "surface" coils in the MRI context.

At least a pair of such "surface" coils is utilized with respective individual RF feed couplings. The surface coils are disposed so that their shaped radiation patterns overlap in a central region intermediate the two coil structures and thereby define an inner-volume (sometimes also referred to as a sub-volume herein) within an object under test (e.g., some organ disposed within the middle of a human body). In this manner, the first and second coils have three-dimensional RF field coupling patterns which overlap within the space provided between the surface coil structures so as to define a limited inner-volume within which MRI imaging may be achieved without imaging an entire cross-section of the object.

The transmitter and receiver coils may have different angular orientations with respect to one another. That is for example, if the coils happen to be substantially planar loops, the planes of the transmit and receive loops could be other than perpendicular or parallel. For example, a transmitting coil may be located at a patient's side while the receiving coil is located at the patient's back. Multiple transmitter and/or receiver coils are also possible and, for some applications, the transmitter and receive coils may even be placed in or near the same plane. For some applications the receiver (or transmitter) coil may take the form of a loop-gap coil (wherein the conductors form a FIG. 8).

Electromagnetic coupling between the coils prevents the transmitter and receiver coils from acting wholly independently. To prevent the receiver coil from seriously degrading the magnetic field of the transmitter coil, the receiver coil must, during transmit times, be made to become part of a resonant circuit with a frequency higher than that of the transmitted RF. For similar reasons, it is also desirable to effect automatic decoupling of the transmit coil during receive time periods.

Detuning of separate transmit/receive circuits during receive/transmit times is, per se, a known technique. For example, the parallel capacitance of receiver RF circuits is automatically increased in some conventional MRI imaging systems during transmit times. Initially, we thought this conventional type of decoupling would suffice.

Decoupling can involve, for example, (a) a switch that opens a circuit through the coil and prevents or attenuates coil current from flowing or (b) a change in the value of coil tuning capacitance. While a switch (e.g., a diode) may suffice for transmitter coils, it is in general a poor choice for receiver coils because all switches are inherently noise sources.

However, contrary to our expectations, we discovered that even though the receiver was detuned during RF transmissions, image quality was still degraded due to inter-coil coupling effects. Upon study and reflection, we have come to realize that this conventional decoupling (by increasing parallel capacitance) causes the resonant frequency to be lowered—and this causes induced currents to tend to shield the sample from the transmitter pulse. (In the extreme example pf adding infinite parallel capacitance, the resonant frequency moves to zero and the coil behaves like a shorted loop. True to Lenz's law, induced currents will establish fields opposing the transmitted field.

However, as we ultimately recognized, if one detunes the receiver coil by increasing its resonant frequency, then the induced currents will establish a field in the same direction as the transmitter field. One way of achieving this desired result is depicted in FIG. 1. During receive time, diodes $D_1$ and $D_2$ do not experience enough forward bias voltage to turn "on" (and thus allow currents to pass through $L_3$). Thus, in the receive mode, $L_3$ is effectively out of the circuit and the receive circuit acts in its usual way. However, during transmit time, a sufficient voltage source appears in series with $L_2$ to forward bias diodes $D_1$ and $D_2$ to an "on" condition. Now that inductor $L_3$ is effectively connected in circuit (in parallel with parallel tuning capacitor $C'_p$), the reactance of the parallel tuning capacitor is reduced to an "effective" capacitive reactance of:

$$C'_p - 1/(w^2 L_3) \quad \text{[Equation 1]}$$

If $L_3$ is sufficiently large, then the resonant frequency of the coil is sufficiently increased so as to achieve the desired decoupling during the transmit mode. This technique is considered very important for successful optimum results.

In the exemplary embodiment of FIG. 1, a transmitter coil L1 is defined by a single conductive loop 10. The coil is conventionally fed through coupling capacitor $C_s$ and $C_p$ by conventional MRI RF transmitter circuits 12 (which include a power adjustment capability 14 as depicted in FIG. 1). For a given NMR RF pulse magnitude and duration, the effective flip angle of NMR nuclei will decrease as a function of distance from the coil. For example, as depicted by dotted lines in FIG. 1, the effective nuclei flip angle achieved at different spatial locations with respect to coil 10 may be conceptually visualized as "cup"-shaped contours 16, 18, 20 (and so forth) of approximately equal flip angle magnitudes. As briefly depicted in FIG. 2 for explanatory purposes, contours 16, 18 and 20 are depicted for flip angles of 110°, 100° and 90°, respectively (or, if the integrated magnitude/time duration of the pulse is doubled, then of 220°, 200° and 180°, respectively). As will be appreciated by those in the art, conventional control circuits 22 may be utilized for controlling the MRI RF transmitter ciruits 12 so as to achieve the desired NMR nutation effect.

At the same time, a receiving coil L2 is defined by a single conductive loop 24 which is disposed on the opposite side of space 26 (within which an object to be imaged is to be positioned). The effective RF radiation pattern of receiver coil L2 has been depicted in FIG. 1 in terms of the effective receiver sensitivity (e.g., in terms of Gauss per amp, or the like) with normalized units of 0.5, 0.4 and 0.3 being depicted for oppositely directed "cup"-shaped contours 28, 30 and 32 of equal receiver sensitivity. Once again, conventional capactive couplings $C'_s$ and $C'_p$ are utilized for coupling receiver coil L2 to a conventional MRI RF receiver 34 (which is typically also controlled by a common control unit 22 in conventional MRI systems).

In the exemplary embodiment, maximum spin echo NMR responses can be expected only in regions that have been properly excited with a succession of an initial flip angle of about 90° followed by one or more flip angles of about 180°. If it is also assumed (for purposes of arbitrary illustration) that a minimum normalized receiver sensitivity of about 0.4 (e.g., as normalized with respect to the 90°-180° point) is required for effective signal reception, then it necessarily follows that the overlapping radiation patterns of surface coils L1 and L2 in FIG. 1 have effectively defined an imaged sub-volume 36—and that only NMR response signals emanating from this selected sub-volume or "inner-volume" will be "seen" by the MRI system. Accordingly, the objective of potentially improved signal-to-noise ratio has been achieved even though the selected volume to be imaged is located considerably inside an object to be imaged.

As those in the art will appreciate, the boundaries of the selected inner-volume 36 will not be so clearly defined as depicted in the drawings (nor necessarily of the depicted shape). Rather, the imaged boundaries will include more gradual transition regions.

As earlier mentioned, it has been discovered that if more uniform transmit fields are desired, then the transmitter coil should be relatively larger than the receiver coil in the exemplary embodiment of FIG. 1. In a presently preferred form of such an embodiment, the relationship between coil spacings and diameters may be as depicted in FIG. 1. Here, the diameter $D_1$ of the transmitting coil is approximately equal to the spacing H between coils while the diameter $D_2$ of the receiving coil is approximately 0.4 to 0.5 that value.

By adjusting the effective output power of the MRI RF transmitter 12 (e.g., via adjustment port 14), the effective location of the imaged inner-volume 36 between the coils 10 and 24 may be adjusted. For example, by reducing the power of the RF transmitter, the location of cup-shaped contours 16, 18 and 20 would all be shrunk and somewhat in the upward direction (from the depictions in FIG. 1. Conversely, by increasing the transmitted power, the cup-shaped contours would be expanded in the downward direction. As should be appreciated, this effectively permits one to vary the size and effective location of the imaged sub-volume 36.

Figure 2:
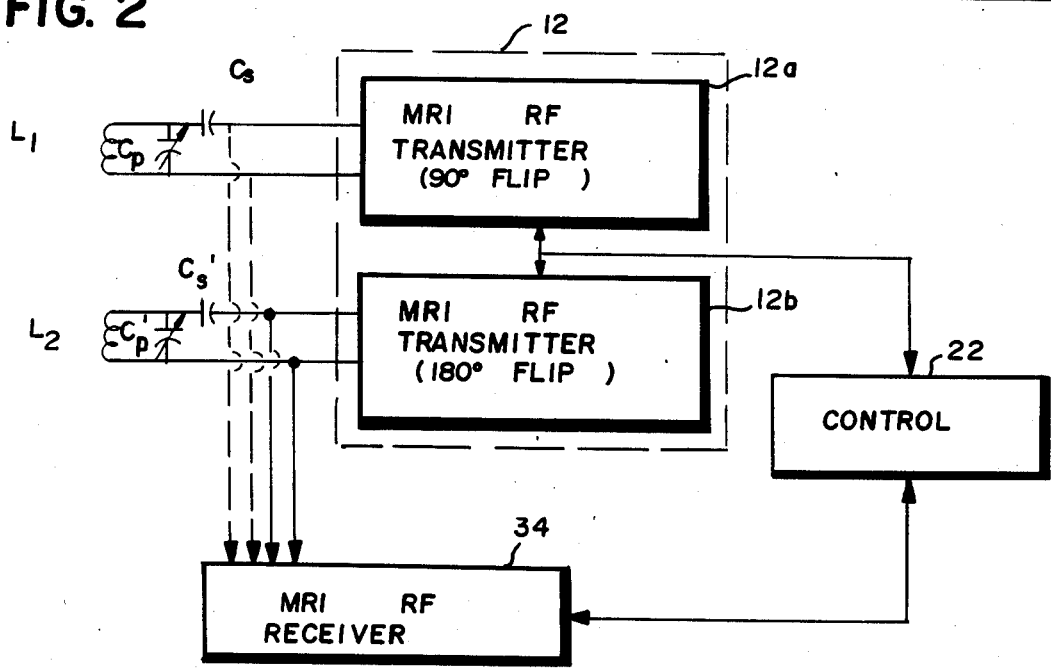
FIG. 2 is a schematic diagram of an alternate exemplary embodiment of this invention.

An alternative embodiment is schematically depicted at FIG. 2. Here, the RF transmitter 12 is constructed with a section 12a for effecting the required 90° NMR nutation and another section 12b for effecting the required subsequent 180° NMR nutation. As depicted in FIG. 2, section 12a drives coil L1 while section 12b drives L2. As before, the overlapping shaped radiation patterns of coils or antennas L1 and L2 effectively define a limited inner-Volume disposed mid-way between the coils in which the requisite NMR nutations are achieved. The resulting NMR spin echo responses may be observed with conventional MRI RF receiver and processing circuits using an auxiliary coil—or one or both of the coils L1 and L2—as should now be appreciated. As mentioned earlier, the diameter of coils L1 and L2 in this alternative embodiment may be of approximately equal value H.

Figure 3:
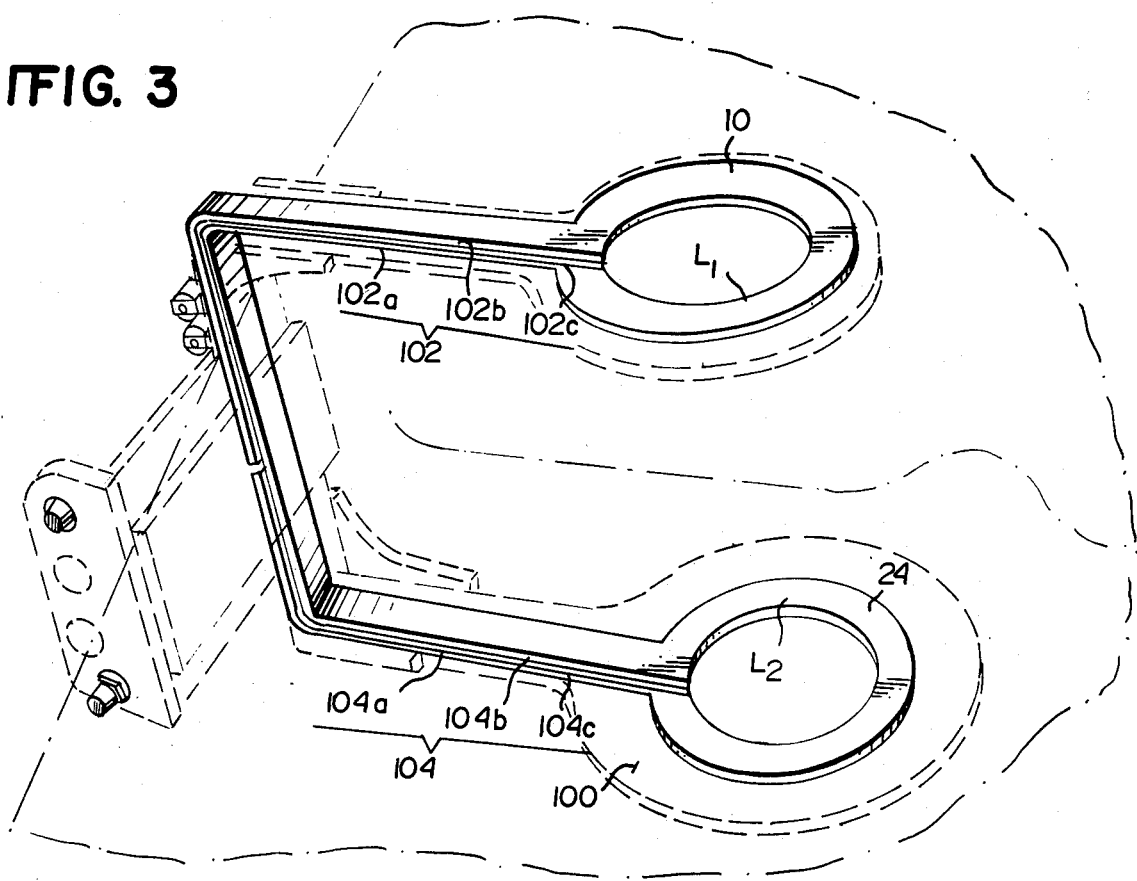
FIGS. 3 and 4 are perspective views of an exemplary physical embodiment of one possible coil structure in accordance with this invention.
Figure 4:
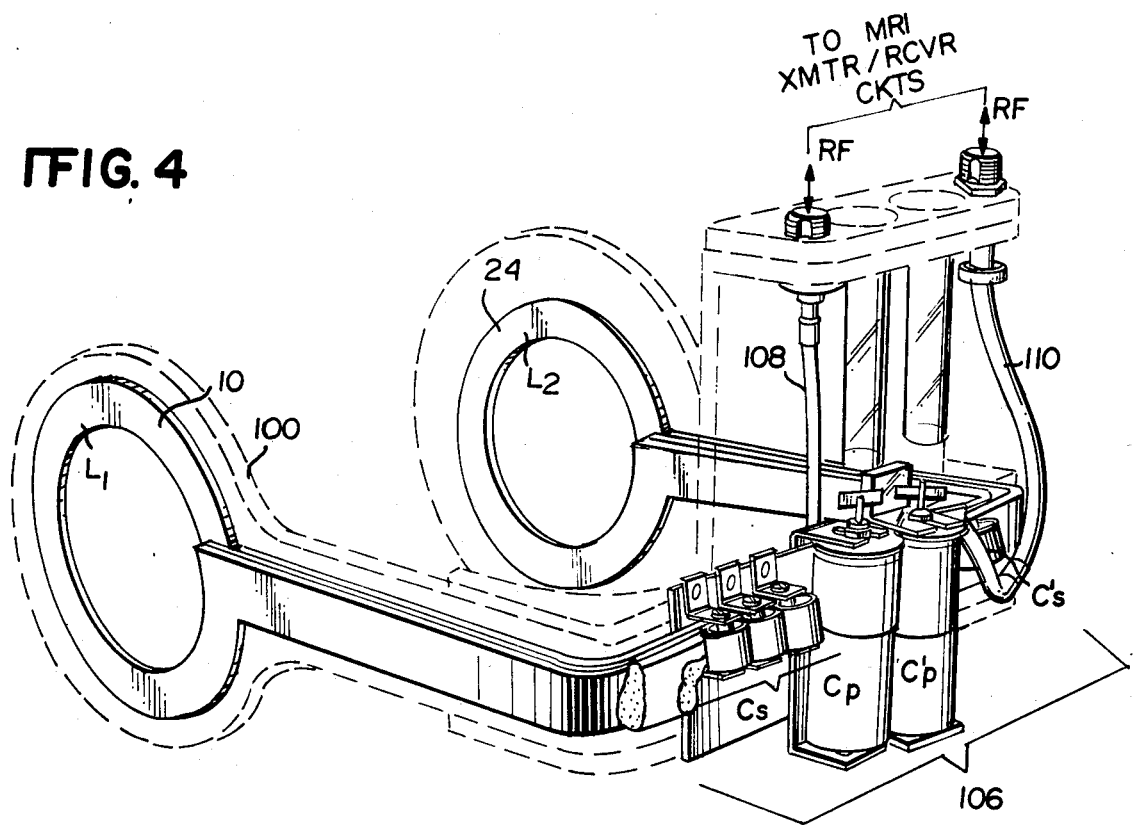

One possible physical construction of the surface coils L1 and L2 is depicted at FIGS. 3 and 4. Here, a plastic frame 100 has been utilized for carrying the coil structures which are formed from shaped copper foil (or thin cut-formed copper sheet). RF transmission lines 102 and 104 may be used to conveniently connect circular loops 10 and 24 respectively via a parallel transmission line formed by parallel copper straps 102*a*, 102*b* (separated by insulative strip 102*c*) and 104*a*. 104*b* (separated by insulative strip 104*c*). As will be appreciated, the transmission line straps are insulated from one another (e.g., by members 102*c* and 104*c*) along a support arm of the plastic structure 100 and may be conveniently brought to a common RF input/output coupling platform 106 which is offset to one side of coils 10, 24—and yet structurally interconnecting them. The "inside" copper strip transmission line conductors may actually be interconnected (or integral with one another, so as to provide a common "ground" RF connection to the shield conductor of RF coaxial cables 108, 110 which, in turn, lead to separate RF input/output ports. The series and parallel coupling capacitances may be conveniently physically and electrically located on the offset mounting platform 106 as depicted in FIGS. 3–4 and as should now be apparent.

Although only a few exemplary embodiments of this invention have been described in detail, those skilled in the art will recognize that many variations and modifications may be made in the exemplary embodiments while yet retaining many of the novel and advantageous features of this invention. Accordingly, all such variations and modifications are to be included in the scope of the appended claims.

What is claimed is:

1. An arrangement of RF coils for MRI of a selected inner-volume of an object, said coil arrangement comprising:
   a first RF coil disposed in a first predetermined position to one side of a space into which an object may be located;
   a second RF coil disposed in a second predetermined position said at another side of said space;
   first RF signal coupling means connected to pass first RF signals into and/or out of said first coil; and
   second RF signal coupling means connected of independently pass second RF signals into and/out of said second coil,
   said first and second coils having three-dimensional RF field coupling patterns which overlap within said space to define a limited inner-volume within which MRI imaging may be achieved without imaging an entire cross-section of said object.

2. An arrangement as in claim 1 wherein:
   said first and second coils each comprise a loop of conductive material.

3. An arrangement as in claim 2 wherein each said loop of conductive material includes a loop of approximately circular configuration.

4. An arrangement as in claim 2 or 3 wherein said coils are separated by a distance H, said first coil includes a diameter of approximately H and said second coil includes a diameter of approximately 0.4 H to 0.5 H.

5. An arrangement as in claim 1, 2 or 3 further comprising:
   MRI RF transmitter means connected to said first coil for transmitting RF pulses via said first coil which effect, in said object, NMR flip angles having a magnitude which decreases as a function of distance from said first coil; and
   MRI RF receiver means connected to said second coil for receiving NMR RF responses having a receiver signal sensitivity which decreases as a function of distance from said second coil,
   wherein a sub-volume is defined within said space between the coils and in which sub-volume said first coil produces substantially 90° and 180° NMR flip angles and said second coil still provides sufficient receiver sensitivity to detect resulting NMR spin echo responses from the sub-volume.

6. An arrangement as in claim 5 further comprising:
   means for adjusting the RF power radiated by said first coil and thereby adjusting the location of said sub-volume within said space.

7. An arrangement as in claim 1, 2, or 3 further comprising:
   first MRI RF transmitter means connected to said first coil for transmitting RF pulses via said first coil which effect, in said object, NMR flip angles having a magnitude which decreases as a function of distance from said first coil; and
   second MRI RF transmitter means connected to said second coil for transmitting RF pulses via said second coil which effect, in said object, NMR flip angles having a magnitude which decreases as a function of distance from said second coil;
   wherein a sub-volume is defined within said space between the coils and in which sub-volume said first coil produces a substantially 90° NMR flip angle, and said second coil produces a substantially 180° NMR flip angle.

8. An arrangement as in claim 7 further comprising:
   MRI RF receiver means connected to at least one of said coils for receiving NMR RF responses with a receiver sensitivity that decreases as a function of distance from such coil(s) thereby also contributing to the definition of said sub-volume.

9. An arrangement as in claim 1 wherein at least one of said RF coils includes:
   decoupling means connected in circuit therewith for automatically increasing the resonant frequency of such circuit during times that the coil is inactive.

10. An arrangement as in claim 9 wherein said decoupling means comprises:
    an inductor connected in series with a diode switch which series-connected elements are, in turn, connected in parallel across said at least one of said RF coils.

11. An arrangement as in claim 10 wherein said diode switch comprises a pair of diodes connected back-to-back together in parallel.

12. An arrangement of RF coils for MRI of a selected inner-volume of an object, said coil arrangement comprising:
    first active RF coil means disposed on one side of a predetermined space into which an object to be imaged is locatable, said first active RF coil means exhibiting a first RF field coupling distribution within said space which decreases as a function of distance therefrom; and second active RF coil means disposed on an opposite side of said space and exhibiting a second RF field coupling distribution within said space which decreases as a function of distance therefrom, said first and second RF field coupling distributions overlapping within said space to define a limited inner-volume within which an MRI image may be achieved without imaging an entire cross-section of the object.

13. An arrangement as in claim 12 wherein said first active RF coil means includes a conductive loop having a first diameter and said second active RF coil means includes a conductive loop having a second diameter smaller than said first diameter.

14. An arrangement as in claim 13 wherein said second diameter is on the order of 0.4 to 0.5 the first diameter.

15. An arrangement as in claim 12, 13 or 14 further comprising:
MRI RF transmitter means operatively connected only to said first active coil; and
MRI RF receiver means operatively connected only to said second active coil.

16. An arrangement as in claim 12, 13 or 14 further comprising:
MRI RF transmitting means operatively connected to one of said active coils for effecting 90° NMR flip angles in said inner-volume and operatively connected to the other of said coils for effecting 180° NMR flip angles in said inner volume.

17. An arrangement as in claim 16 further comprising:
MRI RF receiving means operatively connected to at least one of said active coils for receiving NMR spin echoes from said inner-volume.

18. An arrangement as in claim 12 wherein at least one of said active RF coils includes:
decoupling means connected in circuit therewith for automatically increasing the resonant frequency of such circuit during times that the coil is inactive.

19. An arrangement as in claim 18 wherein said decoupling means comprises:
an inductor connected in series with a diode switch, which series-connected elements are, in turn, connected in parallel across said at least one of said RF coils.

20. An arrangement as in claim 19 wherein said diode switch comprises a pair of diodes connected back-to-back together in parallel.

21. A method for magnetic resonance imaging of a selected inner-volume of an object, said method comprising the steps of:
transmitting NMR RF pulses into said object from at least one RF coil disposed at an external side position and using a shaped RF field distribution so as to produce successive 90° and 180° NMR flip angles only within a limited inner-volume of said object; aud
receiving resulting spin echo NMR RF responses emanating from said inner-volume using an RF coil also disposed at an external side position of the object and having a shaped RF field coupling distribution which overlaps and helps to define said limited inner-volume when considered in conjunction with the shaped RF field distribution used to generate said 90° and 180° NMR flip angles.

* * * * *